United States Patent
Ueda et al.

(10) Patent No.: US 8,690,297 B2
(45) Date of Patent: Apr. 8, 2014

(54) SOL-GEL LIQUID, ELECTROMECHANICAL CONVERSION ELEMENT, LIQUID DISCHARGE HEAD AND INKJET RECORDER

(75) Inventors: Keiji Ueda, Kanagawa-ken (JP); Yoshikazu Akiyama, Kanagawa-ken (JP); Osamu Machida, Kanagawa-ken (JP); Akira Shimofuku, Kanagawa-ken (JP); Takakazu Kihira, Kanagawa-ken (JP)

(73) Assignee: Ricoh Company, Limited, Tokyo (JP)

( * ) Notice: Subject to any disclaimer, the term of this patent is extended or adjusted under 35 U.S.C. 154(b) by 571 days.

(21) Appl. No.: 12/968,630

(22) Filed: Dec. 15, 2010

(65) Prior Publication Data
US 2011/0205307 A1     Aug. 25, 2011

(30) Foreign Application Priority Data

Jan. 28, 2010 (JP) .................. 2010-016959

(51) Int. Cl.
*B41J 2/045* (2006.01)
*H01L 41/18* (2006.01)
*H01L 41/187* (2006.01)

(52) U.S. Cl.
USPC .............. 347/68; 310/311; 252/62.9 PZ

(58) Field of Classification Search
USPC .................. 347/68, 54; 252/62.9 R, 62.9 PZ; 310/311
See application file for complete search history.

(56) References Cited

U.S. PATENT DOCUMENTS

| 7,713,348 B2 | 5/2010 | Kijima et al. |
| 2004/0101980 A1 | 5/2004 | Kurokawa et al. |
| 2013/0022839 A1* | 1/2013 | Kijima et al. ............ 428/701 |

FOREIGN PATENT DOCUMENTS

| JP | 4-168277 | 6/1992 |
| JP | 2003-297825 | 10/2003 |
| JP | 2006-176385 | 7/2006 |
| JP | 2011-9726 | 1/2011 |
| WO | WO 03/098714 A1 | 11/2003 |

OTHER PUBLICATIONS

K. D. Budd et al., "Sol-Gel Processing of $PbTiO_3$, $PbZrO_3$, PZT, and PLZT Thin Films", Proc. Brit. Ceram. Soc., vol. 36, 1985, pp. 107-121.

Amit Kumar et al., "Features of Gold Having Micrometer to Centimeter Dimensions Can Be Formed Through a Combination of Stamping with an Elastomeric Stamp and an Alkanethiol "Ink" Followed by Chemical Etching", Appl. Phys. Lett., vol. 63(14), Oct. 4, 1993, pp. 2002-2004.

* cited by examiner

*Primary Examiner* — Kevin S Wood
(74) *Attorney, Agent, or Firm* — Oblon, Spivak, McClelland, Maier & Neustadt, L.L.P.

(57) ABSTRACT

A sol-gel liquid for use in forming an individualized electromechanical conversion film of an electromechanical conversion element by inkjet methods, including a lead zirconate titanate (PZT) or the PZT and other metal complex oxides; and an organic solvent having properties surrounded by A, B, C, D, E and F in triangular composition diagram of FIG. 3, and having a viscosity of from 3 to 13 mPa·s, a surface tension of 30±5 mN/m and a dehydration rate of from 70 to 80% relative to pure water.

6 Claims, 5 Drawing Sheets

FIG. 5

| GENERIC FORMULA | COMPOUND |
|---|---|
| $A^{2+}B^{4+}O_3$ | $BaTiO_3$ |
| | $PbTiO_3$ |
| | $CaTiO_3$ |
| | $SrTiO_3$ |
| | $PbZrO_3$ |
| | $PbSnO_3$ |
| | $(Sr_{1-x},Ba_x)TiO_3$ |
| | $Pb(Zr_{1-x},Ti_x)O_3$ |
| | $(Pb_{1-y},Ba_y)(Zr_{1-x},Ti_x)O_3$ |
| $A^{2+}(B_{1/3}{}^{2+},B_{2/3}{}^{5+})O_3$ | $Pb(Mg_{1/3},Nb_{2/3})O_3$ |
| | $Pb(Ni_{1/3},Nb_{2/3})O_3$ |
| | $Pb(Zn_{1/3},Nb_{2/3})O_3$ |
| | $Pb(Co_{1/3},Nb_{2/3})O_3$ |
| | $Pb(Cd_{1/3},Nb_{2/3})O_3$ |
| | $Pb(Mg_{1/3},Ta_{2/3})O_3$ |
| $A^{2+}(B_{1/2}{}^{3+},B_{1/2}{}^{5+})O_3$ | $Pb(Fe_{1/2},Nb_{1/2})O_3$ |
| | $Pb(Fe_{1/2},Ta_{1/2})O_3$ |
| | $Pb(Sc_{1/2},Nb_{1/2})O_3$ |
| | $Pb(Yb_{1/2},Nb_{1/2})O_3$ |
| | $Pb(Lu_{1/2},Nb_{1/2})O_3$ |
| | $Pb(In_{1/2},Nb_{1/2})O_3$ |
| $A^{2+}(B_{1/2}{}^{2+},B_{1/2}{}^{6+})O_3$ | $Pb(Cd_{1/2},W_{1/2})O_3$ |
| | $Pb(Mn_{1/2},W_{1/2})O_3$ |
| | $Pb(Zn_{1/2},W_{1/2})O_3$ |
| | $Pb(Mg_{1/2},W_{1/2})O_3$ |
| | $Pb(Co_{1/2},W_{1/2})O_3$ |
| | $Pb(Ni_{1/2},W_{1/2})O_3$ |
| $A^{2+}(B_{2/3}{}^{3+},B_{1/3}{}^{6+})O_3$ | $Pb(Fe_{2/3},W_{1/3})O_3$ |

SOL-GEL LIQUID, ELECTROMECHANICAL CONVERSION ELEMENT, LIQUID DISCHARGE HEAD AND INKJET RECORDER

BACKGROUND OF THE INVENTION

1. Field of the Invention

The present invention relates to a sol-gel liquid used when forming an electromechanical conversion element, an electromechanical conversion element formed with the sol-gel liquid, a liquid discharge head using the electromechanical conversion element, and an inkjet recorder having the liquid discharge head.

2. Description of the Background Art

Forming a thin film of a metal complex oxide by sol-gel methods is known, as disclosed in K. D. Budd, S. K. Dey, D. A. Payne, Proc. Brit. Ceram. Soc. 36, 107 (1985). Forming a self-assembled Mon-layer (SAM) on an Au film with alkanethiol is also known, as disclosed in A. Kumar and G. M. Whitesides, Appl. Phys. Lett., 63, 2002 (1993).

Japanese published examined application No. 4-168277 (JP-H04-168277-A) discloses forming a thick film of a complex oxide on a substrate by sol-gel methods, which is used for a space light modulation element, an actuator of an inkjet printer head, and a sensor. Japanese published unexamined application No. 2003-297825 (JP-2003-297825-A) discloses discharging different sol-gel liquids from two or more inkjet heads to form a ferroelectric thin film in a plane, in which the liquids are uniformly mixed.

International publication No. 2003/098714 discloses a typical configuration of liquid spray head using a piezoelectric thin film.

Japanese published unexamined application No. 2006-176385 (JP-2006-176385-A) discloses a precursor composition for forming a ferroelectric film, a method of preparing the precursor composition, and a precursor composition ink for inkjet application.

Having many advantages, such as scarcely making noise, being capable of printing at high speed, and even being capable of using many kinds of inks printable on inexpensive plain paper, inkjet recorders having an inkjet head are widely used in image forming apparatuses (image recorders) such as printers, facsimiles, and copiers.

The liquid discharge head of the inkjet recorder has a nozzle discharging an ink drop, a pressure chamber (also referred to as a pressurization chamber, a pressurization liquid chamber, a liquid chamber, a discharge chamber, or an ink flow path) connected with the nozzle and a pressure generator pressurizing ink in the pressure chamber to be discharged from the nozzle.

The pressure generator includes both a piezo type, deforming and displacing an oscillation board forming one wall of the pressure chamber to discharge ink drops, using an electromechanical conversion element such as a piezoelectric element; and a bubble (thermal) type generating bubbles with a film by boiling an ink to discharge ink drops, using an electrothermal conversion element such as a heating resistor in the pressure chamber. Further, the piezo type includes a longitudinal oscillation type using deformation in d33 direction, a lateral oscillation (bend mode) type using deformation in d31 direction and a shear mode type using shear deformation. Lately, progress in semiconductor processing and MEMS development has progressed to the point where a thin film actuator in which a pressure chamber and a piezo element are directly formed on a Si substrate are being planned.

FIG. 1 is an embodiment of the liquid discharge head using the electromechanical conversion element. The electromechanical conversion element has a layered structure including a lower electrode, an upper electrode, and an electromechanical conversion film therebetween. (For ease of illustration, a liquid feeder, flow paths, etc. are omitted.)

FIG. 2 is an embodiment including plural liquid discharge heads shown in FIG. 1. Each pressure chamber includes an individual electromechanical conversion element for generating pressure to discharge ink.

The electromechanical conversion film is formed of lead zirconate titanate (PZT), barium titanate, etc. These include plural metal oxides as a main component and are typically referred to as metal complex oxides.

Conventionally, an electromechanical conversion film material is deposited on a lower electrode by known film forming technologies such as vacuum film forming. Patterning of the upper electrode is made by photolithographic etching after forming the upper electrode. Patterning of the electromechanical conversion film and the lower electrode are similarly made to form an electromechanical conversion element.

However, dry etching of the metal complex oxides, particularly PZT, is not easy, and a specific type of reactive ion etching (RIE) combining ICP plasma, ECR plasma and helicon plasma is needed, resulting in a cost increase for the production apparatuses.

Individualized PZT film forming methods include a hydrothermal synthesis method selectively growing PZT on a Ti metal. The resultant PZT film needs a thickness not less than 5 μm to have sufficient pressure resistance (an electric field applied to the PZT film easily breaks down a film having a thickness less than 5 μm), and thus cannot have a desired thinness. When the element is formed on a Si substrate, the Si substrate needs protection because the hydrothermal synthesis is performed under a strongly-alkaline aqueous solution. Other methods include vacuum deposition methods and AD methods, but as a practical matter both of them have too many problems to use.

For these reasons, a need exists for a sol-gel liquid stably and continuously dischargeable under simple discharge conditions, when an individualized electromechanical conversion film is formed by partially modifying the surface of a lower electrode and coating the modified part with a sol-gel liquid by inkjet methods.

SUMMARY OF THE INVENTION

Accordingly, an object of the present invention is to provide a sol-gel liquid stably and continuously dischargeable under simple discharge conditions when an individualized electromechanical conversion film is formed by partially modifying the surface of a lower electrode and coating the modified part with a sol-gel liquid by inkjet methods.

Another object of the present invention is to provide an electromechanical conversion element using the sol-gel liquid.

A further of the present invention is to provide a liquid discharge head using the element.

Another object of the present invention is to provide an inkjet recorder having the head.

These objects and other objects of the present invention, either individually or collectively, have been achieved by the discovery of a sol-gel liquid for use in forming an individualized electromechanical conversion film of an electromechanical conversion element by inkjet methods, comprising lead zirconate titanate (PZT) or a PZT and other metal complex oxides, and an organic solvent having properties surrounded by A, B, C, D, E and F in the following triangular composition diagram showing solubility parameter properties, and having a viscosity of from 3 to 13 mPa·s, a surface tension of 30±5 mN/m and a dehydration rate of from 70 to 80% relative to pure water.

These and other objects, features and advantages of the present invention will become apparent upon consideration of the following description of the preferred embodiments of the present invention (taken in conjunction with the accompanying drawings.

BRIEF DESCRIPTION OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein:

FIG. 5 shows typically-reported sol-gel liquid materials;

DETAILED DESCRIPTION OF THE INVENTION

Figure 1:
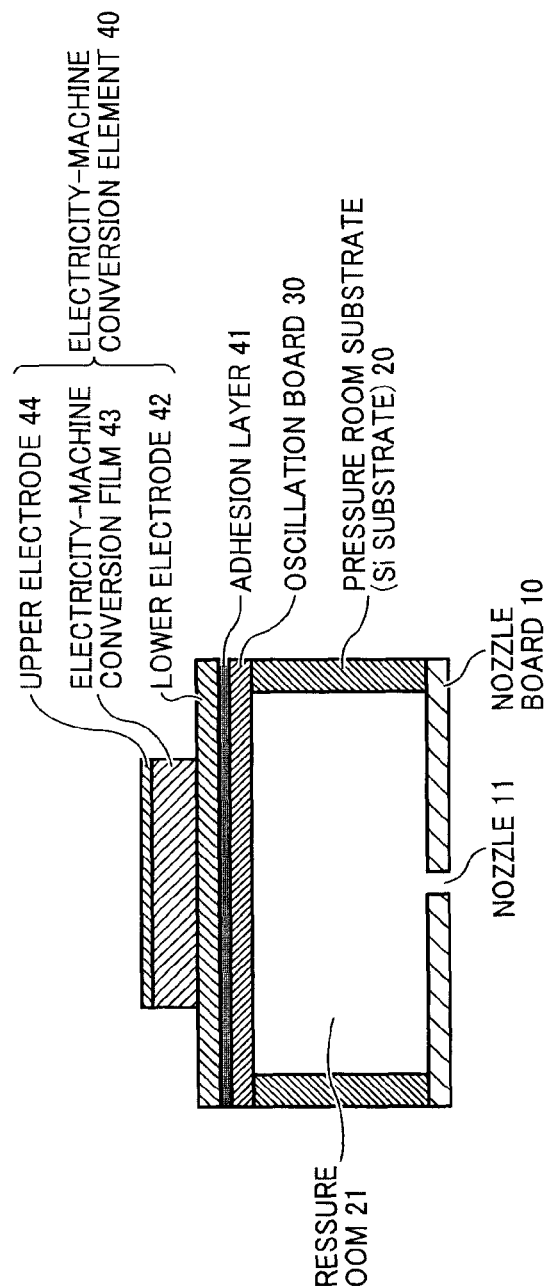
FIG. 1 is a schematic view illustrating an embodiment of a liquid discharge head of a nozzle.
Figure 2:
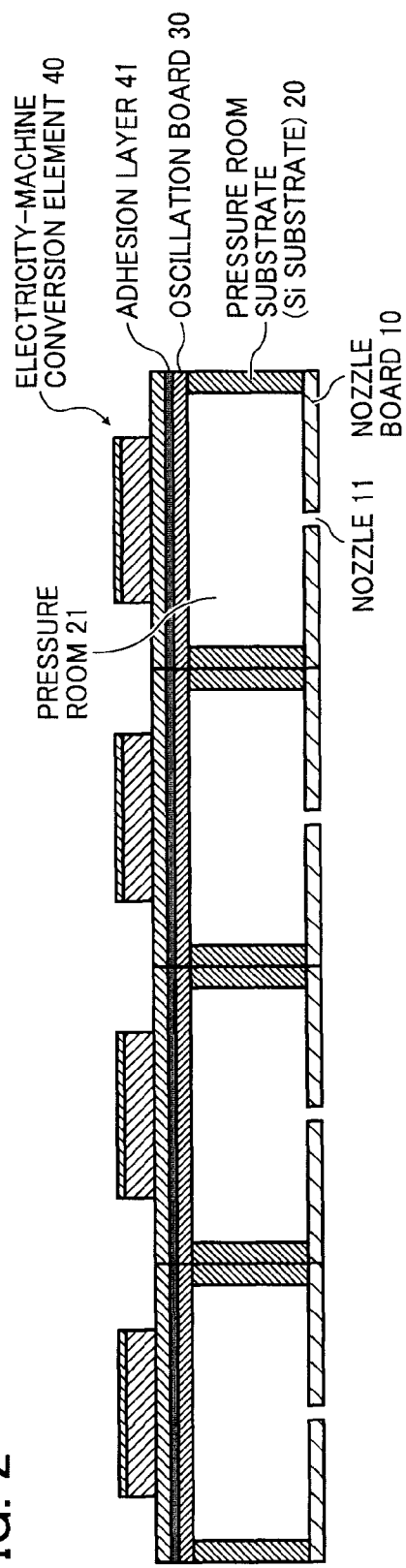
FIG. 2 is a schematic view illustrating an embodiment of arrangement of plural liquid discharge heads in FIG. 1.

The present invention provides a sol-gel liquid stably and continuously dischargeable under simple discharge conditions when an individualized electromechanical conversion film is formed by partially modifying the surface of a lower electrode and coating a sol-gel liquid by inkjet methods on the modified part.

Particularly, the present invention relates to a sol-gel liquid for use in forming an individualized electromechanical conversion film of an electromechanical conversion element by inkjet methods, comprising:

a lead zirconate titanate (PZT) or a PZT and other metal complex oxides; and an organic solvent having properties surrounded by A, B, C, D, E and F in the following triangular composition diagram showing solubility parameter properties, and having a viscosity of from 3 to 13 mPa·s, a surface tension of 30±5 mN/m and a dehydration rate of from 70 to 80% relative to pure water.

Hereinafter, the present invention will be explained in detail.

The present invention relates to a sol-gel liquid for use in forming a lateral oscillation (bend mode) type electromechanical conversion element (thin film actuator) using deformation in d31 direction among the piezo types.

The electromechanical conversion film used as a thin film actuator is typically formed of a metal complex oxide film. The sol-gel method is very effectively used as a method of forming a metal complex oxide film having a proper electromechanical convertibility.

The sol-gel method hydrolyzes an inorganic or organic metal compound in a solution to prepare a reaction product, polycondensates the product to form a polymer, and heats the polymer to prepare a metal complex oxide (ceramic). The polymer is a liquid called "sol" when having a low polymerization degree, and is further diluted with a proper solvent to prepare a "precursor". The "precursor" is typically referred to as a "sol-gel liquid", and which is used in the present invention as well.

When a metal complex oxide film is formed by sol-gel methods, a sol-gel liquid is typically coated on a substrate by dipping or spin coat methods, and heated to form a metal complex oxide film on the substrate. When the metal complex oxide film is used as an electromechanical conversion film, a PZT having good electromechanical conversion (piezoelectric) property is widely used.

Materials of PZT are lead acetate, zirconium alkoxide and titanium alkoxide, and a 2-methoxy ethanol which is a common solvent for them is used to prepare a sol-gel liquid of PZT (refer to K. D. Budd, S. K. Dey, D. A. Payne, Proc. Brit. Ceram. Soc. 36, 107 (1985)).

PZT is a solid dispersion of lead zirconate ($PbZrO_3$) and lead titanate ($PbTiO_3$), having a formula $Pb(Zr_{1-x}Ti_x)O3$ ($0<x<1$), and has different properties according to the ratio. PZT having a molar ratio ($PbZrO_3/PbTiO_3$) of 53/47, i.e., $x=0.47$ typically has a good electromechanical convertibility (piezoelectricity), and is abbreviated to PZT (53/47).

The lead acetate, zirconium alkoxide and titanium alkoxide are weighed according to the formula to be used.

However, a "thermal (heating)" process is needed after sol-gel liquid coating. At that time, particularly in a heating process for crystallization, lead atoms in the coating are known to partially vaporize. Therefore, when a complex oxide including lead such as PZT is prepared, extra lead in an amount of from 5 to 20% relative to a chemically theoretical compositional amount is typically added to the materials, foreseeing vaporization/decrease of lead atoms in the heating process. Such a process of adding extra lead is typically made not only in the process of forming a film in the present invention, but also in "bulk" sinter/preparation process.

Moisture in the air easily hydrolyzes the metal alkoxide, and a proper amount of a stabilizer such as acetylacetone, ethylacetate and diethanolamine may be added to the sol-gel liquid.

Besides PZT, the complex oxide includes barium titanate. Barium alkoxide and titanium alkoxide are dissolved in a common solvent to prepare a sol-gel liquid of barium titanate. When a PZT film is formed on the whole surface of the base substrate, after a PZT sol-gel liquid is coated thereon by spin coat methods, etc., heating processes such as solvent drying, thermodecomposition and crystallization are made to form a crystallized film. However, a coated film changes to a crystallized film with a volume contraction, the concentration of the sol-gel liquid needs adjusting to form a film having a thickness not greater than 100 nm for one time coating for forming a crystallized film without crack.

Meanwhile, a PZT film is used for an electromechanical conversion element of a liquid discharge head, the film needs to have a thickness of from 1 to 2 μm. However, the coating needs repeating for a few dozen times to form a PZT film having such a thickness.

When the PZT film formed on the whole surface of a base substrate is used for an electromechanical conversion element of a liquid discharge head, a process of individualizing (patterning) the PZT film in accordance with layout of the pressure chamber is needed, which costs much and causes many difficulties. Then, the present inventors invented methods of forming an electromechanical conversion film, through forming a film by sol-gel methods and patterning at the same time.

The methods selectively form a PZT film (electromechanical conversion film) only on a necessary site by sol-gel methods to form an electromechanical conversion element having an individualized PZT film. When a sol-gel liquid is selectively coated, SAM film forming methods controlling film formation by dip methods are used as surface quality improvement for controlling wettability of the liquid. In addition, a SAM film is selectively formed only on a necessary site to control liquid wettability (a contact angle on the surface) of the site, and a sol-gel liquid is repeatedly coated on the surface by inkjet method to form an individualized PZT film. This can largely decrease quantity of the sol-gel liquid to be used, but the sol-gel liquid which is a precursor of the PZT film, typically has a low viscosity and a small surface tension. Conditions of properly discharging the liquid from a nozzle of an inkjet head are very limited, and it is very difficult to stably continue the discharge operation.

However, the concentration of the sol-gel liquid is adjusted, i.e., diluted to form the PZT film of the present invention, having a thickness not greater than 100 nm for one time coating. Therefore, the liquid has a low viscosity and a small surface tension.

Table 1 shows a relationship between typical ink properties (such as viscosities, surface tensions and dehydration rates for inkjet printing) and ink discharged status from nozzles arranged in an inkjet head and print quality.

TABLE 1

| Viscosity | Low | ↔ | High |
|---|---|---|---|
| | Mist generates | | Undischargeable |
| Surface tension | Small | ↔ | Large |
| | Ink leaks | | Unfluidable to Nozzles |
| | | | Undischargeable |
| Dehydration rate | Low | ↔ | High |
| | Ink bleeding | | Dried and solidified at nozzles |
| | after printing | | Undischargeable |

When the ink in typical inkjet printing has low viscosity, microscopic ink drops called "mist" are sprayed and peripherally spread when the ink drops are discharged from nozzles of the inkjet head, resulting in deterioration of print quality. At the same time, the microscopic ink drops adhere to the surface of the inkjet head and contaminate the head, resulting in spray hindrance of the inks drops.

When the ink has excessively high viscosity, the ink drops do not discharge even when a pressure is generated in the pressure chamber to discharge the ink from the nozzle.

When the ink has small surface tension, the ink leaks from the nozzle to contaminate the surface of the inkjet head and inhibits the inks drops from discharging, resulting in deterioration of print quality.

When the ink has excessively high surface tension, the ink does not flow in the nozzle, and the ink drops cannot be discharged from the nozzle.

When the ink has low dehydration rate, after the ink drop is discharged from the nozzle and landed on a material to be printed, it takes long time until dried and fixed and mixes with another ink drop landed later, resulting in deterioration of print quality such as bleeding.

When the ink has high dehydration rate, the ink is dried and solidified at the nozzle, and the ink drop cannot be discharged from the nozzle.

As mentioned above, the ink viscosity, the surface tension and the dehydration rate need to precisely be specified in inkjet printing.

These fit into the sol-gel liquid as well when the PZT sol-gel liquid is coated by inkjet methods while patterned to prepare an electromechanical conversion element.

However, as mentioned above, the sol-gel liquid forming a PZT film has low viscosity and small surface tension, and is not preferably used as an ink for use in inkjet methods.

As a matter of course, the sol-gel liquid can be discharged from the nozzle of the inkjet head to prepare an electromechanical conversion element.

However, allowable discharge conditions are very limited, and it is very difficult to stably discharge the sol-gel liquid having low viscosity and low surface tension in proper conditions for a long time.

The sol-gel liquid capable of forming an electromechanical conversion film having a proper electromechanical convertibility and stably and continuously discharging from the nozzle of the inkjet head was studied.

First, as Example 1 <Synthesis of Sol-Gel Liquid> mentioned later, a PZT sol-gel liquid (PZT precursor solution) was prepared, and requirements of a proper sol-gel liquid and a proper organic solvent for adjustment were studied.

(a) Requirements of Proper Sol-Gel Liquid

In order to find the concentration of the sol-gel liquid precursor forming a crystallized film having a thickness not greater than 100 nm with one-time coating without a crack, sol-gel liquids having various precursor concentrations were prepared to perform evaluation of film formation. The concentration of the sol-gel liquid was adjusted with a common solvent 2-methoxyethanol when synthesized. The sol-gel liquid was coated by an inkjet coater having the inkjet head GEN4 from Ricoh Printing Systems, Ltd.

As a result, the concentration of the sol-gel liquid precursor was preferably not greater than 0.3 mol/L to form a proper crystallized film with one-time coating. However, the sol-gel liquid, the concentration of which was adjusted with only 2-methoxyethanol, had low viscosity, and therefore the liquid generates mist when discharged and the surface of the inkjet head was contaminated in a short time since coating started. 2-methoxyethanol had a viscosity of 1.57 mPa·s, and the sol-gel liquid, the precursor concentration of which was adjusted with only 2-methoxyethanol, had a viscosity of 2.52 mPa·s.

In order to find a sol-gel liquid properly dischargeable stably and continuously, one or more organic solvents for adjustment besides 2-methoxyethanol were mixed with the sol-gel liquid to prepare various sol-gel liquids and the dischargeability and film formability thereof were evaluated.

As a result, a sol-gel liquid properly dischargeable stably and continuously satisfies the following requirements 1) to 3).
1) a viscosity of from 3 to 13 mPa·s
2) a surface tension of 30±5 mN/m
3) a dehydration rate of from 70 to 80% relative to pure water When the liquid has a viscosity less than 3 mPa·s, the liquid generates mist when discharged and the surface of the inkjet head was contaminated in a short time since coating started. When greater than 13 3 mPa·s, the liquid cannot be discharged from the nozzle.

When the liquid has a surface tension less than 25 mN/m, the contrast of the patterned form deteriorates (the boundary does not have a sharp form). When greater than 35 mN/m, the liquid cannot be discharged from the nozzle.

When the liquid has a dehydration rate, the contrast of the patterned form deteriorates (the boundary does not have a sharp form). When the liquid has a high dehydration rate, the liquid is dried and solidified at the nozzle, and cannot be discharged from the nozzle.

(b) Proper Organic Solvent for Adjustment

However, although stably and continuously dischargeable from the inkjet head, many sol-gel liquids expand after coated or form uneven crystallized films. The causes were examined in detail to find that the additional organic solvent for adjusting the sol-gel liquid was not uniformly mixed with the basic sol-gel liquid using 2-methoxyethanol to perfection.

Therefore, the organic solvent for adjustment preparing a sol-gel liquid satisfying the above 1) to 3) requirements and having good mixability with 2-methoxyethanol which is a main solvent of the sol-gel liquid was studied.

Figure 3:
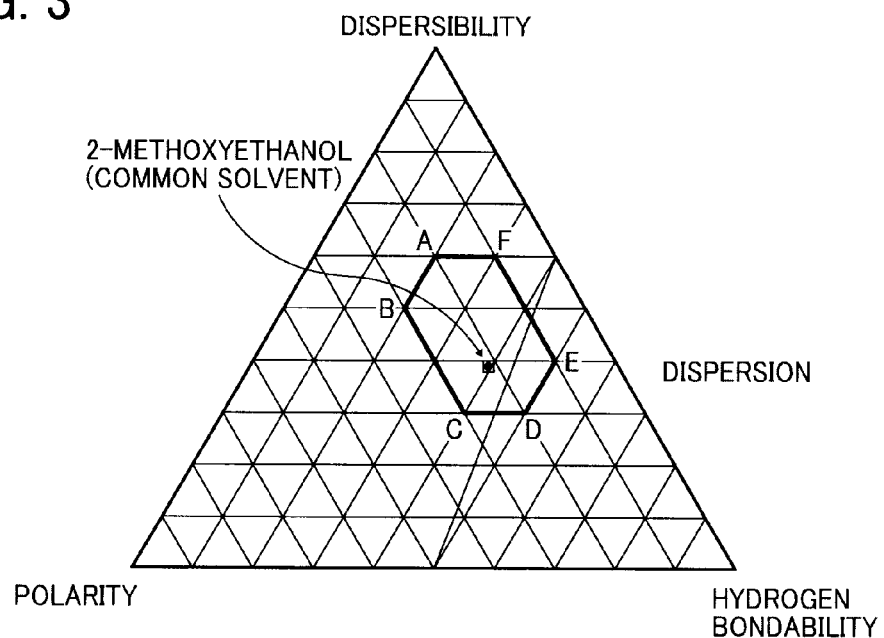
FIG. 3 is a diagram showing a solubility parameter of the organic solvent for use in the present invention.

As an index of determining mixability of tow or more organic solvents, an index called "Solubility Parameter (SP value)" is used. The index is a digitalized value of the dispersibility, polarity and hydrogen bondability of the organic solvent. FIG. 3 is a triangular composition diagram in which properties of an organic solvent are plotted. Organic solvents having close plotted indices each other are empirically known to have good mixability.

SP of 2-methoxyethanol was plotted in FIG. 3. All SP in FIG. 3 and other diagrams are in compliance with data shown in "HANSEN SOLUBILITY PARAMETERS Second Edition" from Charles M. Hansen CRC Press.

An organic solvent for adjustment having a SP close to that of 2-methoxyethanol in FIG. 3 can prepare a sol-gel liquid having good uniformity. However, the organic solvent having a SP close thereto is close thereto in viscosity and other properties as well. The reason why a different organic solvent for adjustment is mixed in a sol-gel liquid synthesized with 2-methoxyethanol as a common solvent is, e.g., to increase viscosity of the sol-gel liquid to smoothly discharge from an inkjet head. Therefore, it is not satisfactory to mix an organic solvent having a SP close to that of 2-methoxyethanol with the sol-gel liquid.

Instead of finding an organic solvent having a SP close to that of 2-methoxyethanol, a scope of the SP of organic solvents, which does not cause problems of a sol-gel liquid after mixed was studied.

As a result, organic solvents for adjustment having SPs in a scope enclosed by a heavy line from A, B, C, D, E to F in FIG. 3 were proved not to cause problems of a sol-gel liquid after mixed.

A sol-gel liquid including the organic solvent for adjustment can maintain same liquid properties as those of the liquid right after prepared even after a half year passes after prepared. When mixed with an organic solvent having a SP showing larger hydrogen bondability than SPs in the scope, a sol-gel liquid has higher hygroscopicity and absorbs moisture in the air. A precursor in the liquid is likely to be hydrolyzed, and the sol-gel liquid deteriorates in discharge stability from an inkjet head and pot life. When mixed with an organic solvent having larger polarity, a precursor in the liquid deteriorates in solubility and dispersibility, resulting in problems of discharge stability from an inkjet head and electromechanical conversion film performance. When mixed with an organic solvent having larger dispersibility, a sol-gel liquid deteriorates in uniformity due to poor mixability with 2-methoxyethanol, resulting in deterioration of electromechanical conversion film performance.

Among organic solvents having SPs in the scope enclosed by the heavy line from A, B, C, D, E to F in FIG. 3, combinations of sol-gel liquids and organic solvents for adjustment satisfying the above 1) to 3) were studied.

As a result, sol-gel liquids including 2-methoxyethanol and organic solvents for adjustment with combinations and mixing ratios shown in Tables 2 and 3 mentioned later have good dischargeability, stability thereof, electromechanical conversion film performance of the resultant film, and have good stability and pot lives as sol-gel liquids.

Figure 4:
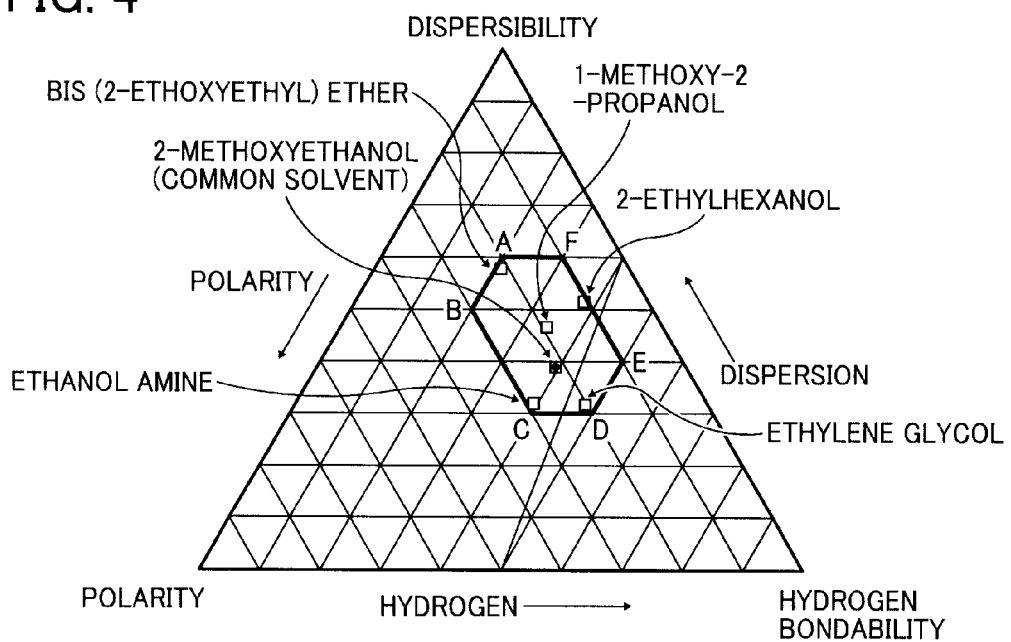
FIG. 4 is a diagram showing a solubility parameter of an organic solvent for adjustment.

In FIG. 4, SPs of the common solvent 2-methoxyethanol, and of selected organic solvents for adjustment, i.e., ethyleneglycol, bis(2-ethoxyethyl)ether, ethanolamine, 2-ethylhexanol and 1-methoxy-2-propanol are plotted.

The sol-gel liquid including PZT can form a film having sufficient electromechanical convertibility. However, in order to comply with a demand for higher electromechanical convertibility, further preferred electromechanical conversion film compositions were studied.

As a result, when at least one of the following components (1) to (3) is used as another metal complex oxide in addition to the PZT which is a two-component solid solution, the resultant electromechanical conversion film can have a higher piezoelectric constant.

(1) Pb ($Mg_{1/3}$, $Nb_{2/3}$)$O_3$ (=PMN)
(2) Pb ($N_{1/3}$, $Nb_{2/3}$)$O_3$ (=PNN)
(3) Pb ($Zn_{1/3}$, $Nb_{2/3}$)$O_3$ (=PZN)

Preferred compositional ratios (PMN/PZT) of PMN to PZT include 0.375/0.625 and 0.125/0.875, or a Pb element substituted with Ba or Sr at 20 mol % at a maximum is preferably used. Preferred compositional ratios (PNN/PZT) of PNN to PZT include 0.5/0.5. Preferred compositional ratios (PZN/PNN/PZT) include 0.25/0.10/0.65.

Besides these, typical materials shown in FIG. 5 can be used in the present invention. In addition, a Mn oxide can be included as an additive.

To prepare a sol-gel liquid including the other metal complex oxide, an alkoxide material including a metal element forming the other metal complex oxide is placed in a predetermined amount when placing zirconium tetra-n-butoxide and titanium isopropoxide in <Preparation of Sol-Gel Liquid> of Example 1 mentioned later.

Preparation of electromechanical conversion element of the present invention includes a first process of partially modifying the surface of a substrate which is a lower electrode, a second process of coating the sol-gel liquid of the present invention on the modified surface, a third process of drying, pyrolyzing and crystallizing the sol-gel liquid to form an electromechanical conversion film, a fourth process of repeating the first to third processes to make the film have a desired thickness, and a fifth process of placing an upper electrode on the electromechanical conversion film. These processes form an electromechanical conversion element having an individualized PZT film.

In the first process, a SAM film is selectively formed only on a site needing the film to control liquid wettability (a contact angle to the surface). The lower electrode can be formed with known materials, and typically with platinum. The second process is performed by inkjet methods. The fifth process, e.g., applies a platinum ink by inkjet methods.

Thus, such simple processes in which suitable discharge conditions are easily set up and discharge operation can stably be continued can form an electromechanical conversion element having performances equivalent to those of bulk ceramics. Further, the processes can more stably be continued for a long time.

Figure 6:
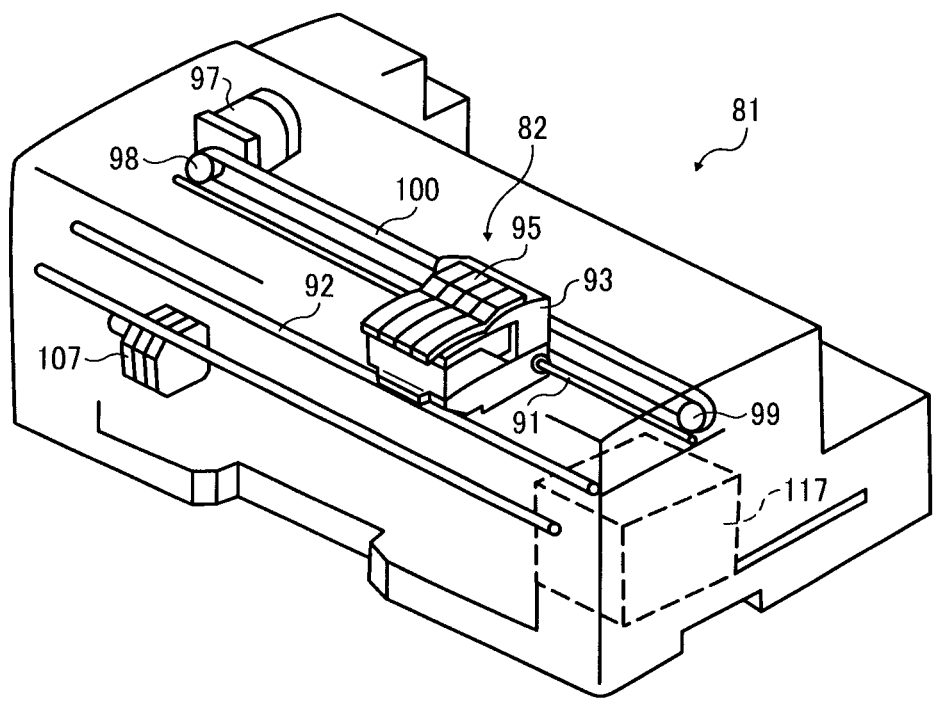
FIG. 6 is a perspective explanatory view of an embodiment of the inkjet recorder of the present invention.
Figure 7:
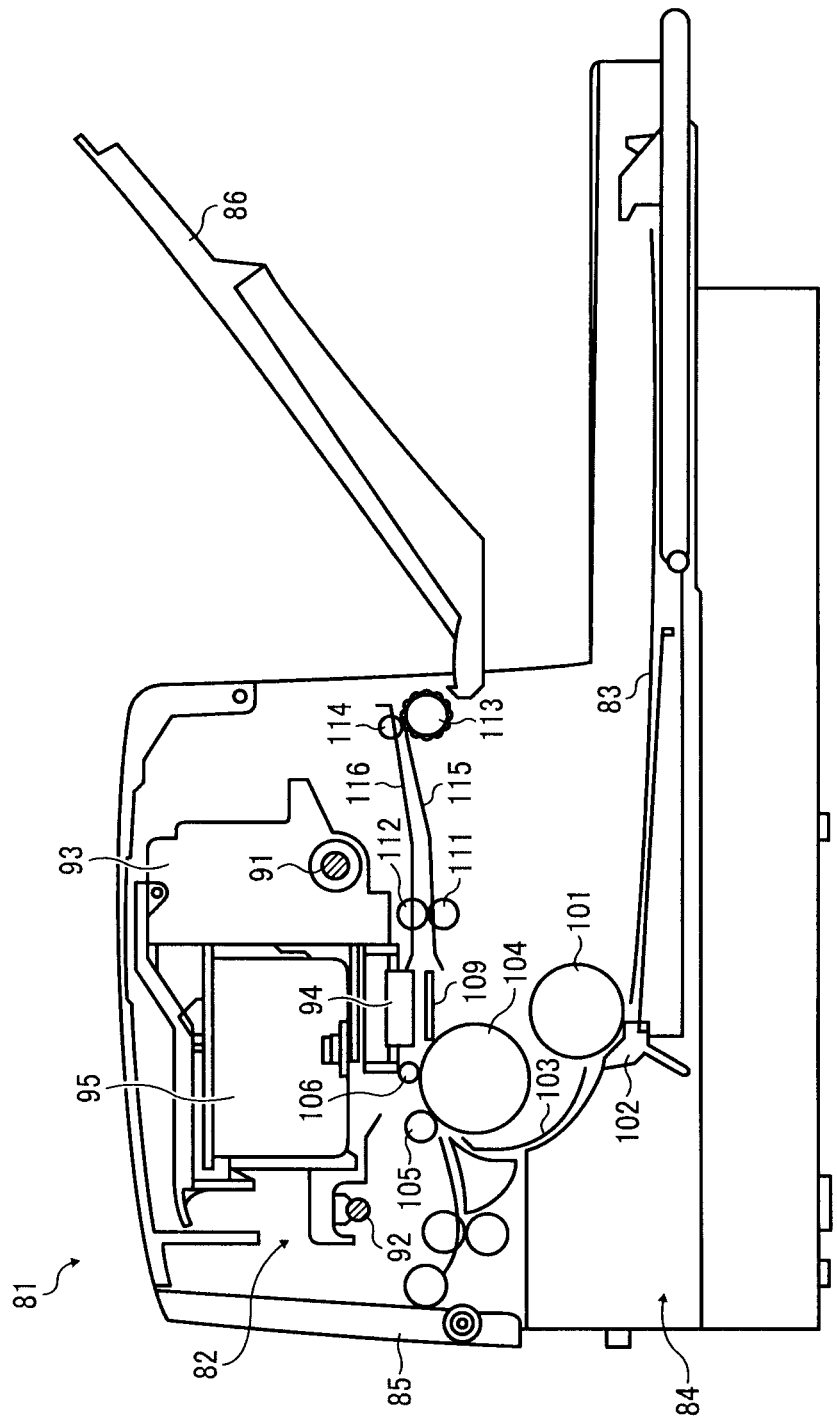
FIG. 7 is a lateral explanatory view of a mechanical part of the embodiment of the inkjet recorder of the present invention.

Next, an embodiment of the inkjet recorder equipped with the liquid discharge head of the present invention will be explained, referring to FIGS. 6 and 7. FIG. 6 is a perspective explanatory view of the embodiment, and FIG. 7 is a lateral explanatory view thereof. The inkjet recorder produces images having improved quality because of stably discharging ink drops without poor ink drop discharge due to poor oscillation board drive.

A recorder main body 81 includes a carriage 93 movable in a main scanning direction, a recording head 94 formed of the inkjet head of the present invention installed in the carriage 93, a printing mechanism 82 formed of an ink cartridge 95 feeding an ink to the recording head 94, etc., and others. At the bottom of the main body 81, a removable paper feed cassette (or a paper feed tray) 84 capable of containing multiple papers 83 from before can be installed. Further, a manual tray 85 for manually feeding the papers 83 is openable. After images are recorded on the papers 83 fed from the paper feed cassette 84 or the manual tray 85, they are discharged on a paper discharge tray 86.

The printing mechanism 82 slidably holds a carriage 93 with guide rods 91 and 92 laterally bridged on right and left side panels (not shown). The carriage 93 has the recording heads 94 each discharging color inks yellow (Y), cyan (C), magenta (M) and black (Bk), respectively such that plural ink discharge openings (nozzles) are located downward in a direction crossing the main scanning direction. The carriage 93 has the exchangeable ink cartridges 95 for feeding each color ink to the recording heads 94.

The ink cartridges 95 has an air opening above, which takes air in, a feed opening feeding an ink to the inkjet head below, and a porous body filled with the ink inside. The porous body has a capillary force having the ink fed to the inkjet head keep a slight negative pressure. The recording heads 94 for each color are used, but one recording head having nozzles discharging ink drops for each color may be used.

The backward side (downstream side of the paper feeding direction) of the carriage 93 is slidably set in the main guide rod 91 and the foreside (upstream side of the paper feeding direction) thereof is slidably placed on the secondary guide rod 92. In order to movably scan the carriage 93 in a main scanning direction, a timing belt 100 is extended between a drive pully 98 rotationally driven by a main scanning motor 97 and a driven pully 99, the timing belt 100 is fixed on the carriage 93, and the forward reverse rotation of the main scanning motor 97 reciprocates the carriage 93.

In order to feed the paper 83 set in the paper cassette 84 to the lower side of the head 94, a paper feed roller 101 and a friction pad 102 separating and feeding the paper 83 from the paper cassette 84, a guide member 103 guiding the paper 83, a feed roller 104 reversing and feeding the paper 83, a feed skid 105 pressed against the circumferential surface of the feed roller 104, and a pointed skid 106 regulating a feed angle of the paper 83 from the feed roller 104. The feed roller 104 is rotationally driven by a sub-scanning motor 107 through a line of gears.

A printed paper receiving member 109 which is a paper guide member guiding the paper 83 fed from the feed roller 104 in accordance with a travel range of the main scanning direction of the carriage 93 is arranged. At the downstream side of the paper feed direction from the printed paper receiving member 109, a feed skid 111 rotationally driven to feed the paper 83 to a discharge direction and a spur 112 are located. Further, a paper discharge roller 113 feeding the paper 83 to a paper discharge tray 86 and a spur 114, and guide members 115 and 116 are arranged.

The recording head 94 is driven in accordance with an image signal while the carriage 93 is transferred to record one line, discharging an ink onto the paper 83 at a stop. After the paper is transferred for a predetermined amount, the next line is recorded. The recording operation is finished when receiving a record finishing signal or a signal showing the back end of the paper 83 reaches a recording area, and the paper 83 is discharged. At a position out of the recording area at the right end side of the travel direction of the carriage 93, a restorer 117 restoring a poor discharge of the head 94 is located. The restorer 117 has a cap means, a suction means and a cleaning means. While the carriage 93 is on standby, the carriage is transferred by the restorer 117 and the head 94 is capped by the cap means, and the discharge opening is kept wet to prevent poor discharging due to drying of the ink. Further, the inks free from recording are discharged for keeping the ink viscosity of all the discharging openings constant to maintain stable dischargeability.

When a poor discharge occurs, the cap means seals the discharge opening (nozzle) of the head 94 and the suction means sucks out air bubbles together with the ink from the discharge opening through a tube. The ink and dust adhering to the discharge opening is removed by the cleaning means to restore the poor discharge. The sucked ink is discharged in a waste ink reservoir (not shown) at the bottom of the apparatus and absorbed in an ink absorber in the waste ink reservoir.

Having generally described this invention, further understanding can be obtained by reference to certain specific examples which are provided herein for the purpose of illustration only and are not intended to be limiting. In the descriptions in the following examples, the numbers represent weight ratios in parts, unless otherwise specified.

EXAMPLES

Example 1

Preparation of Sol-Gel Liquid

The following materials a) to c) were used as starting materials.

a) lead acetate trihydrate [$Pb(CH_3COO)_2 \cdot 3H_2O$] having a molecular weight of 379.3]

b) zirconium tetra-n-butoxide [$Zr(OCH_2CH_2CH_3)_4$ having a molecular weight of 383.7]

c) titanium isopropoxide {$Ti[OCH(CH_3)_2]_4$ having a molecular weight of 284.3}

These materials were weighed so as to have one mol equivalent of a composition [$Pb_{1.10}(Zr_{0.53}Ti_{0.47})O_3$] including lead in an amount of excessive 10% mol relative to zirconate titanate having a stoichiometric composition [$Pb(Zr_{0.53}Ti_{0.47})O_3$]. Namely, 417.3 g of lead acetate trihydrate, 203.4 g of zirconium tetra-n-butoxide and 133.6 g of titanium isopropoxide were used. Lead was excessively used to prevent deterioration of crystallinity due to lead drop in a heating process.

Next, after the lead acetate trihydrate was dissolved in 2-methoxyethanol ($CH_3OCH_2CH_2OH$ having a molecular weight of 76.1), the solution was heated to have a boiling point of the solvent and dehydrated (may be dehydrated with a rotary evaporator).

Next, the zirconium tetra-n-butoxide and the titanium isopropoxide dissolved in 2-methoxyethanol were placed in the dehydrated 2-methoxyethanol solution of the lead acetate trihydrate, and the solution was heated to have a boiling point of the solvent to proceed an alcohol exchange reaction and an esterification reaction (polycondensation reaction). Thus, a sol-gel liquid (PZT precursor solution) was prepared.

Further, organic solvents for adjustment and their mixing ratios shown in Tables 2 and 3 were added into the sol-gel liquid (PZT precursor solution) to impart suitable properties to the sol-gel liquid for forming a film by inkjet methods.

Next, an electromechanical conversion element was prepared using the sol-gel liquid.

First, the surface of a platinum substrate (lower electrode) is partially modified with methyl thiol to form a SAM film.

Next, the sol-gel liquid was coated by an inkjet coater having the inkjet head GEN4 from Ricoh Printing Systems, Ltd. on the surface-modified part, and the sol-gel liquid was dried, pyrolyzed and crystallized to form an electromechanical conversion film.

The above-mentioned operation was repeated for 15 times to form an electromechanical conversion film having a thickness about 1.5 μm.

Next, a platinum ink was coated by the inkjet coater on the electromechanical conversion film to form a lower electrode. Thus, an electromechanical conversion element was prepared. The film formation by the inkjet method and the electromechanical conversion film performance were good as shown in Tables 2 and 3. Thus, such simple processes can form an electromechanical conversion element having performances equivalent to those of bulk ceramics. Further, the processes can more stably be continued for a long time.

◉ in the column "Film Format ion by Inkjet Method" in Tables 2 and 3 means the following 4 conditions are satisfied.

(1) A sol-gel liquid can be discharged from an inkjet head for a long time. Namely, an inkjet nozzle is not blocked.

(2) A sol-gel liquid can continuously be discharged straight for a long time and landed on a desired place. (When an inkjet head is contaminated, the sol-gel liquid scatters in unexpected directions and lands on undesired parts.)

(3) A sol-gel liquid is not dried to block a nozzle while not discharged.

(4) A sol-gel liquid landed evenly expands to form a coated film having an even thickness.

◉ in the column "Electromechanical Conversion Film Performance" in Tables 2 and 3 means the following condition is satisfied.

(1) When a specific electric field is applied to the electromechanical conversion film, a sufficient form change (deformation) is made.

Example 2

With PMN

Lead acetate trihydrate [$Pb(CH_3COO)_2 \cdot 3H_2O$ having a molecular weight of 379.3], magnesium ethoxide [$Mg(OCH_2CH_3)_2$ having a molecular weight of 114.4] and niobium ethoxide [$Nb(OCH_2CH_3)_5$ having a molecular weight of 318.2] were used as starting materials, and weighed to have a stoichiometric composition $Pb(Mg_{1/3}Nb_{2/3})O_3$ (=PMN).

Next, after the lead acetate trihydrate was dissolved in 2-methoxyethanol, the solution was heated to have a boiling point of the solvent and dehydrated.

Next, the magnesium ethoxide and the niobium ethoxide dissolved in 2-methoxyethanol were placed in the dehydrated 2-methoxyethanol solution of the lead acetate trihydrate, and the solution was heated to have a boiling point of the solvent to proceed an alcohol exchange reaction and an esterification reaction (polycondensation reaction). Thus, a sol-gel liquid (PMN precursor solution) was prepared.

Next, the PMN precursor solution and the PZT precursor solution prepared in Example 1 were mixed to have a composition at a molar ratio close to 0.375PMN-0.625PZT.

Further, organic solvents for adjustment and their mixing ratios shown in Tables 2 and 3 were added into the sol-gel liquid (PMN-PZT precursor mixed solution) to impart suitable properties to the sol-gel liquid for forming a film by inkjet methods.

Next, an electromechanical conversion element was prepared using the sol-gel liquid.

As a result, the film formation by the inkjet method and the electromechanical conversion film performance were good ◉ as they were in Example 1. Thus, such simple processes can form an electromechanical conversion element having performances equivalent to those of bulk ceramics. Further, the processes can more stably be continued for a long time.

Example 3

With PNN

Lead acetate trihydrate [$Pb(CH_3COO)_2 \cdot 3H_2O$ having a molecular weight of 379.3], acetylacetone nickel [$Ni(acac)_2$ having a molecular weight of 256.9] and niobium ethoxide [$Nb(OCH_2OH_3)_5$ having a molecular weight of 318.2] were used as starting materials, and weighed to have a stoichiometric composition $Pb(Ni_{1/3}Nb_{2/3})O_3$ (=PNN).

Next, after the lead acetate trihydrate was dissolved in 2-methoxyethanol, the solution was heated to have a boiling point of the solvent and dehydrated.

Next, the acetylacetone nickel and the niobium ethoxide dissolved in 2-methoxyethanol were placed in the dehydrated 2-methoxyethanol solution of the lead acetate trihydrate, and the solution was heated to have a boiling point of the solvent to proceed an alcohol exchange reaction and an esterification reaction (polycondensation reaction). Thus, a sol-gel liquid (PNN precursor solution) was prepared.

Next, the PNN precursor solution and the PZT precursor solution prepared in Example 1 were mixed to have a composition at a molar ratio close to 0.5PNN-0.5PZT.

Further, organic solvents for adjustment and their mixing ratios shown in Tables 2 and 3 were added into the sol-gel liquid (PNN-PZT precursor mixed solution) to impart suitable properties to the sol-gel liquid for forming a film by inkjet methods.

Next, an electromechanical conversion element was prepared using the sol-gel liquid.

As a result, the film formation by the inkjet method and the electromechanical conversion film performance were good ◉ as they were in Example 1. Thus, such simple processes can form an electromechanical conversion element having performances equivalent to those of bulk ceramics. Further, the processes can more stably be continued for a long time.

Example 4

With PZN+PNN

Lead acetate trihydrate [$Pb(CH_3COO)_2 \cdot 3H_2O$ having a molecular weight of 379.3], zinc acetate dihydrate [$Zn(CH_3COO)_2 \cdot 2H_2O$ having a molecular weight of 219.5] and niobium ethoxide [$Nb(OCH_2CH_3)_5$ having a molecular weight of 318.2] were used as starting materials, and weighed to have a stoichiometric composition $Pb(Zn_{1/3}Nb_{2/3})O_3$ (=PZN).

Next, after the lead acetate trihydrate was dissolved in 2-methoxyethanol, the solution was heated to have a boiling point of the solvent and dehydrated.

Next, the zinc acetate dihydrate and the niobium ethoxide dissolved in 2-methoxyethanol were placed in the dehydrated 2-methoxyethanol solution of the lead acetate trihydrate, and the solution was heated to have a boiling point of the solvent to proceed an alcohol exchange reaction and an esterification reaction (polycondensation reaction). Thus, a sol-gel liquid (PZN precursor solution) was prepared.

Next, the PZN precursor solution and the PNN precursor solution prepared in Example 3 were mixed to have a composition at a molar ratio close to 0.25PZN-0.10PNN-0.65PZT.

Further, organic solvents for adjustment and their mixing ratios shown in Tables 2 and 3 were added into the sol-gel liquid (PZN-PNN-PZT precursor mixed solution) to impart suitable properties to the sol-gel liquid for forming a film by inkjet methods.

Next, an electromechanical conversion element was prepared using the sol-gel liquid.

As a result, the film formation by the inkjet method and the electromechanical conversion film performance were good ◉ as they were in Example 1. Thus, such simple processes can form an electromechanical conversion element having performances equivalent to those of bulk ceramics. Further, the processes can more stably be continued for a long time.

TABLE 2

| | Organic Solvent | 2-methoxyethanol (common solvent) | Ethyleneglycol | Bis(2-ethoxyethyl)ether |
|---|---|---|---|---|
| | Formula | $CH_3OCH_2CH_2OH$ | $HOCH_2CH_2OH$ | $(C_2H_5OCH_2CH_2)_2O$ |
| | Molecular weight | 76.1 | 62.07 | 162.20 |
| Solubility Parameter | Spd(dispersibility) | 16.20 | 17.00 | 15.80 |
| | SPp(polarity) | 9.20 | 11.00 | 5.90 |
| | SPh(hydrogen bondability) | 16.40 | 26.00 | 5.60 |
| | Density g/ml | 0.96 | 1.11 | 0.91 |
| | Boiling point ° C. | 124.0 | 197.3 | 189.0 |
| | Viscosity mPa·s | 1.57 | 16.10 | 1.40 |
| | Mixing ratio (in sol-gel liquid) | 2 | 2 | 1 |
| Sol-gel liquid properties after adjusted | Precursor density mol/L | | 0.30 | |
| | Viscosity mPa·s | | 3.56 | |
| | Surface tension mN/m | | 34.3 | |
| | Drying speed (relative to pure water) | | 78% | |
| | Film formation by inkjet method | | ◉ | |
| | Electromechanical conversion film performance | | ◉ | |

TABLE 3

| | Organic Solvent | 2-methoxyethanol (common solvent) | Ethanol amine | 2-ethylhexanol | 1-methoxy-2-propanol |
|---|---|---|---|---|---|
| | Formula | $CH_3OCH_2CH_2OH$ | $N_2NCH_2CH_2OH$ | $C_4H_9CH(C_2H_5)CH_2OH$ | $CH_3OCH_2CH_2OH$ |
| | Molecular weight | 76.1 | 61.08 | 130.23 | 90.12 |
| Solubility Parameter | Spd(dispersibility) | 16.20 | 17.00 | 15.90 | 15.60 |
| | SPp(polarity) | 9.20 | 15.50 | 3.30 | 6.30 |
| | SPh(hydrogen bondability) | 16.40 | 21.20 | 11.80 | 11.60 |
| | Density g/ml | 0.96 | 1.01 | 0.83 | 0.92 |
| | Boiling point ° C. | 124.0 | 170.0 | 184.0 | 118.5 |
| | Viscosity mPa·s | 1.57 | 19.33 | 9.80 | 1.81 |
| | Mixing ratio (in sol-gel liquid) | 3 | 2 | 1 | 1 |
| Sol-gel liquid properties after adjusted | Precursor density mol/L | | | 0.30 | |
| | Viscosity mPa·s | | | 4.10 | |
| | Surface tension mN/m | | | 32.1 | |
| | Drying speed (relative to pure water) | | | 72% | |
| | Film formation by inkjet method | | | ◉ | |
| | Electromechanical conversion film performance | | | ◉ | |

This application claims priority and contains subject matter related to Japanese Patent Application No. 2010-016959, filed on Jan. 28, 2010, the entire contents of which are hereby incorporated by reference.

Having now fully described the invention, it will be apparent to one of ordinary skill in the art that many changes and modifications can be made thereto without departing from the spirit and scope of the invention as set forth therein.

What is claimed as new and desired to be secured by Letters Patent of the United States is:

1. A sol-gel liquid comprising:
a lead zirconate titanate (PZT) or the lead zirconate titanate PTZ and other metal complex oxides; and
an organic solvent having properties surrounded by A, B, C, D, E and F in the triangular composition diagram of FIG. 3
and having a viscosity of from 3 to 13 mPa·s, a surface tension of 30±5 mN/m and a dehydration rate of from 70 to 80% relative to pure water.

2. The sol-gel liquid of claim 1, wherein the other metal complex oxides comprise a member selected from the group consisting of the following (1) to (3):
 (1) $Pb(Mg_{1/3}, Nb_{2/3})O_3$;
 (2) $Pb(Ni_{1/3}, Nb_{2/3})O_3$; and
 (3) $Pb(Zn_{1/3}, Nb_{2/3})O_3$.

3. An electromechanical conversion element, comprising an electromechanical conversion film sandwiched between a lower electrode and an upper electrode,
wherein the electromechanical conversion film is formed by an inkjet method with the sol-gel liquid according to claim 1.

4. A liquid discharge head, comprising the electromechanical conversion element according to claim 3.

5. An inkjet recorder, comprising the liquid discharge head according to claim 4.

6. The sol-gel liquid of claim 1, wherein the solvent is at least one selected from the group consisting of bis(2-ethoxyethyl)ether, ethanol amine, 1-methoxy-2-propanol, 2-ethylhexanol, and ethylene glycol.

\* \* \* \* \*